(12) United States Patent
Tao et al.

(10) Patent No.: US 8,737,069 B2
(45) Date of Patent: May 27, 2014

(54) ELECTRONIC DEVICE WITH FAN

(75) Inventors: Heng Tao, Wuhan (CN); Xiang Zhang, Wuhan (CN); Zhi-Guo Zhang, Wuhan (CN); Li-Fu Xu, Wuhan (CN)

(73) Assignees: Hong Fu Jin Precision Industry (WuHan) Co., Ltd., Wuhan (CN); Hon Hai Precision Industry Co., Ltd., New Taipei (TW)

( * ) Notice: Subject to any disclaimer, the term of this patent is extended or adjusted under 35 U.S.C. 154(b) by 340 days.

(21) Appl. No.: 13/241,209

(22) Filed: Sep. 23, 2011

(65) Prior Publication Data

US 2012/0155017 A1 Jun. 21, 2012

(30) Foreign Application Priority Data

Dec. 21, 2010 (CN) .......................... 2010 1 0598590

(51) Int. Cl.
*H05K 7/20* (2006.01)
(52) U.S. Cl.
USPC . 361/695; 361/694; 361/679.31; 361/679.48; 361/679.49; 361/679.5; 165/80.3; 165/104.34
(58) Field of Classification Search
USPC ............... 361/679.31, 679.48, 679.49, 679.5, 361/694, 695; 165/80.3, 104.34
See application file for complete search history.

(56) References Cited

U.S. PATENT DOCUMENTS

| | | | | |
|---|---|---|---|---|
| 5,854,738 A * | 12/1998 | Bowler | ........................... | 361/695 |
| 5,973,921 A * | 10/1999 | Lin | ................................. | 361/695 |
| 6,134,115 A * | 10/2000 | Sim et al. | ....................... | 361/747 |
| 6,252,770 B1 * | 6/2001 | Yu et al. | ......................... | 361/695 |
| 6,269,001 B1 * | 7/2001 | Matteson et al. | ............. | 361/695 |
| 6,317,320 B1 * | 11/2001 | Cosley et al. | .................. | 361/695 |
| 6,351,380 B1 * | 2/2002 | Curlee et al. | .................. | 361/695 |
| 6,549,406 B1 * | 4/2003 | Olesiewicz et al. | ............ | 361/695 |
| 6,714,411 B2 * | 3/2004 | Thompson et al. | ........... | 361/695 |
| 6,775,139 B2 * | 8/2004 | Hsueh | ............................ | 361/697 |
| 6,865,078 B1 * | 3/2005 | Chang | ............................ | 361/695 |
| 6,961,248 B2 * | 11/2005 | Vincent et al. | ................ | 361/796 |
| 6,999,313 B2 * | 2/2006 | Shih | .............................. | 361/695 |
| 7,054,155 B1 * | 5/2006 | Mease et al. | ................... | 361/695 |
| 7,227,748 B2 * | 6/2007 | Garnett | ..................... | 361/679.31 |
| 7,236,361 B2 * | 6/2007 | Cote et al. | ..................... | 361/695 |
| 7,245,490 B2 * | 7/2007 | Chou et al. | .................... | 361/695 |
| 7,301,768 B2 * | 11/2007 | Fan et al. | ....................... | 361/695 |
| 7,457,119 B2 * | 11/2008 | Wang et al. | ................... | 361/700 |
| 7,522,415 B2 * | 4/2009 | Fan et al. | ....................... | 361/695 |
| 7,580,259 B2 * | 8/2009 | Hsiao | ............................ | 361/695 |
| 7,599,179 B2 * | 10/2009 | Chen et al. | ............... | 361/679.48 |
| 7,639,496 B2 * | 12/2009 | Lv et al. | ......................... | 361/695 |
| 7,684,191 B1 * | 3/2010 | Willis et al. | .................... | 361/695 |
| 7,697,287 B2 * | 4/2010 | Yin | ................................ | 361/695 |
| 7,845,903 B2 * | 12/2010 | Li | ................................. | 415/186 |
| 7,862,410 B2 * | 1/2011 | McMahan et al. | ............ | 454/184 |
| 7,990,707 B2 * | 8/2011 | Hung | ............................ | 361/695 |
| 8,031,467 B2 * | 10/2011 | Cheng et al. | ................... | 361/694 |
| 8,047,780 B2 * | 11/2011 | Chen et al. | .................. | 415/213.1 |

(Continued)

*Primary Examiner* — Anatoly Vortman
(74) *Attorney, Agent, or Firm* — Novak Druce Connolly Bove + Quigg LLP

(57) ABSTRACT

An electronic device includes a cage and a fan module. The cage includes a mounting plate defining a ventilation hole. A positioning portion is located in the ventilation hole. A restriction is located on an inner surface of the positioning portion. The height of the restriction is such as to strictly require the fan module to be in the correct orientation when it is fitted to the electronic device.

18 Claims, 7 Drawing Sheets

(56) References Cited

U.S. PATENT DOCUMENTS

| | | | |
|---|---|---|---|
| 8,142,149 B2* | 3/2012 | Sun .......................... 415/213.1 |
| 8,199,485 B2* | 6/2012 | Cheng et al. ............... 361/679.5 |
| 8,451,605 B2* | 5/2013 | Chen ........................... 361/695 |
| 2004/0207983 A1* | 10/2004 | Lu et al. ...................... 361/695 |
| 2006/0120040 A1* | 6/2006 | Chen ........................... 361/695 |
| 2006/0285292 A1* | 12/2006 | Fan et al. ..................... 361/695 |
| 2007/0064386 A1* | 3/2007 | Peng et al. ................... 361/687 |
| 2007/0297132 A1* | 12/2007 | Wang et al. .................. 361/695 |
| 2009/0168324 A1* | 7/2009 | Lai et al. .................. 361/679.33 |
| 2009/0257192 A1* | 10/2009 | Li ................................. 361/695 |
| 2011/0096499 A1* | 4/2011 | Li ................................. 361/695 |
| 2011/0122573 A1* | 5/2011 | Peng et al. ............... 361/679.48 |

* cited by examiner

ELECTRONIC DEVICE WITH FAN

BACKGROUND

1. Technical Field

The present disclosure relates to an electronic device with a fan.

2. Description of Related Art

A fan is provided in an electronic device for cooling electronic components. However, the fan can be incorrectly installed if care is not taken during the installation. Therefore, there is room for improvement in the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
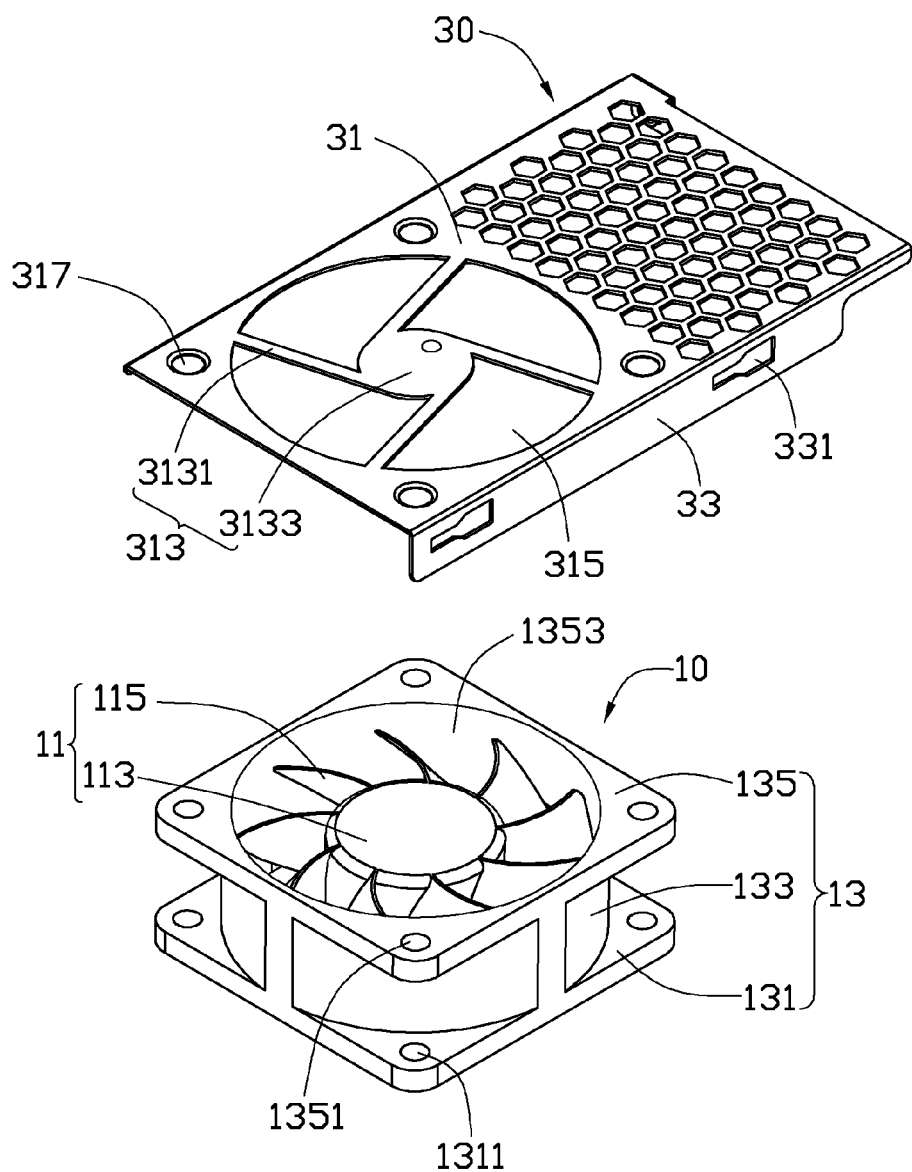
FIG. 1 is an exploded, isometric view of an electronic device in accordance with an embodiment.

Referring to FIG. 1, an electronic device in accordance with one embodiment includes a fan module 10 and a cage 30.

Figure 2:
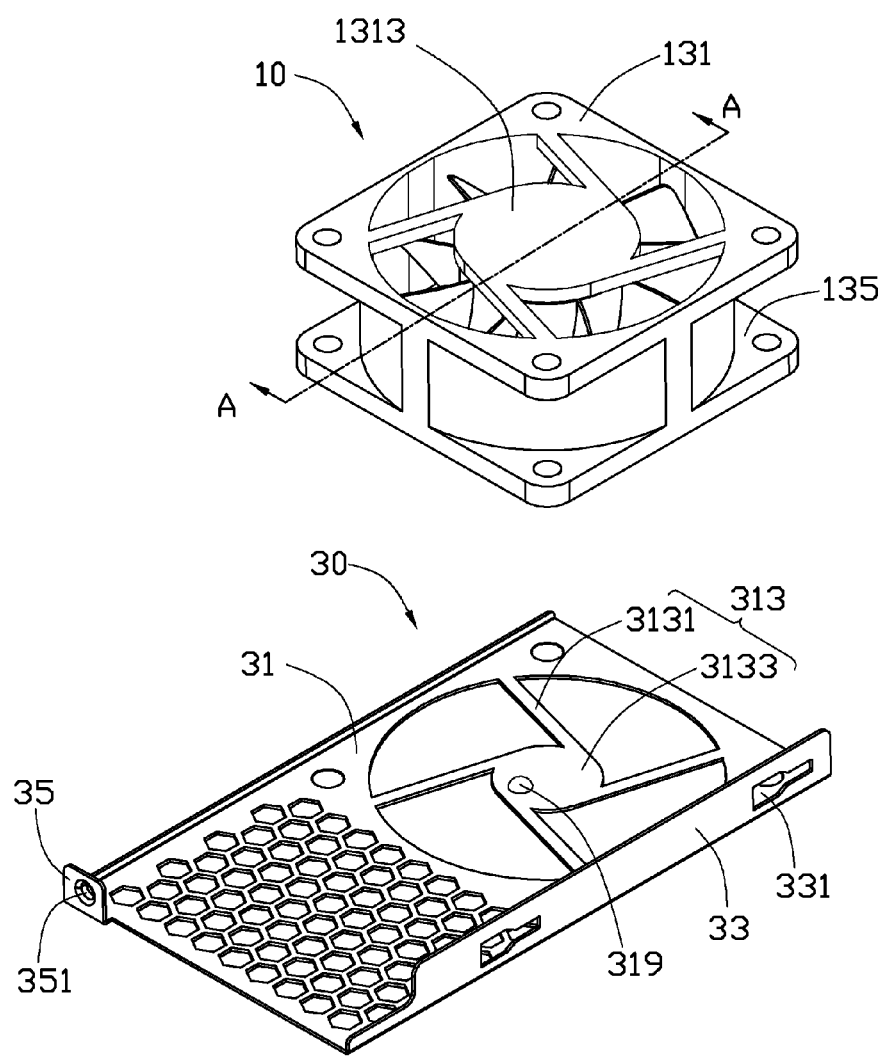
FIG. 2 is similar to FIG. 1, but viewed from a different aspect.
Figure 3:
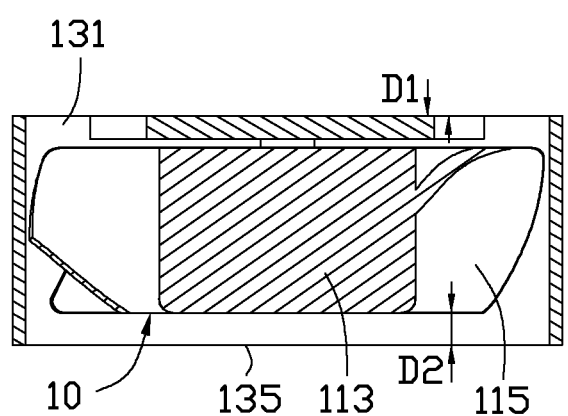
FIG. 3 is a cross-sectional view of the fan module of FIG. 1 along the line A-A.

The fan module 10 includes a bracket 13 and a fan 11. The bracket 13 includes a body 133, a first sidewall 131, and a second sidewall 135. The first and second sidewalls 131, 135 are located on opposite sides of the body 133. A holding space 1353 is defined in the bracket 13 through the first sidewall 131, the body 133, and the second sidewall 135. A plurality of first mounting holes 1311 is defined in the first sidewall 131. A plurality of second mounting holes 1351 is defined in the second sidewall 135. Referring to FIG. 2, a mounting portion 1313 is located in the holding space 1353 and connected to the plate 31. A first distance D1 (shown in FIG. 3) is defined between the outer surface of the mounting portion and the outer surface of the first sidewall. In one embodiment, the outer surface of the mounting portion is aligned with the outer surface of the first sidewall, and the distance D1 is approximately equal to zero.

The fan 11 is received in the holding space 1353 and includes a motor 113 and a plurality of blades 115 located on the shaft of the motor 113. The motor 113 is secured to the mounting portion 1313. A second distance D2 (shown in FIG. 3) is defined between the outer surface of the motor and the outer surface of the second sidewall.

Referring to FIG. 1, the cage 30 includes a mounting plate 31 and a flange 33 located on the mounting plate 31. A ventilation hole 315 is defined in the mounting plate 31. A positioning portion 313 is located in the ventilation hole 315 and connected to the mounting plate 31. In an embodiment, the positioning portion 313 includes a base 3133 and four fingers 3131 connected to the mounting plate 31, with each finger 3131 being substantially perpendicular to an adjacent finger 3131. A restriction 319, such as a simple nub or boss, is located on the inner surface of the positioning portion. A height H (shown in FIG. 6) of the restriction 319 relative to the inner surface of the positioning portion is defined, and the height H is greater than the first distance D1, but less than the second distance D2. A plurality of securing holes 317 is defined in the mounting plate 31 around the ventilation hole 315, corresponding to the first and second mounting holes 1311, 1351. Two locking holes 331 are defined in the flange 33. An ear 35 is located on the mounting plate 31, and an installing hole 351 is defined in the ear 35. In one embodiment, the ear 35 and the flange 33 are substantially perpendicular to one another, on two edges of the mounting plate 31 which adjoin.

Figure 4:
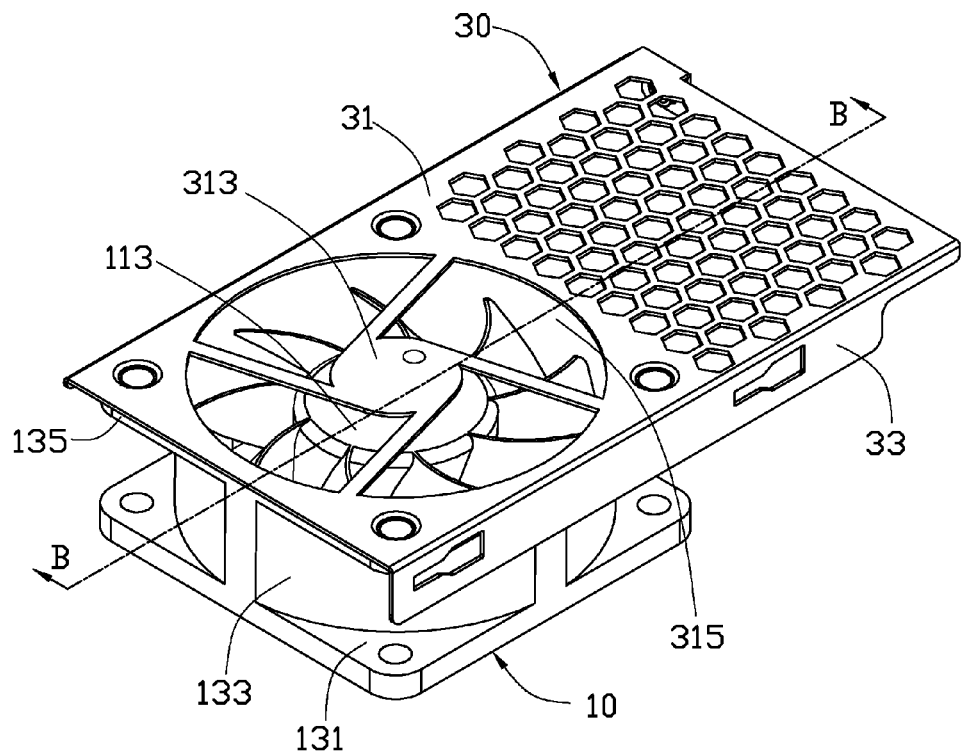
FIG. 4 is a view of the assembled device of FIG. 1.
Figure 5:
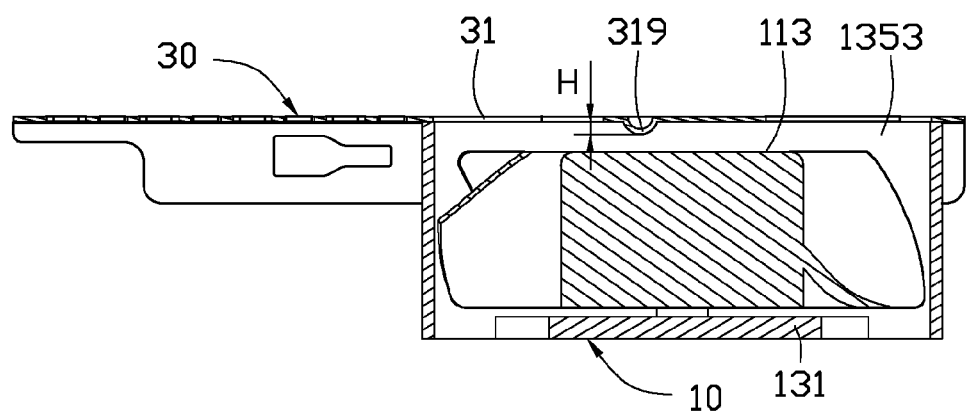
FIG. 5 is a cross-sectional view taken along the line B-B in FIG. 4, and shows the fan module correctly assembled.

Referring also to FIG. 4 and FIG. 5, in assembly, if the second sidewall 135 is placed on the inner surface of the positioning portion, because the height H of the restriction 319 is less than the second distance D2, the restriction 319 does not abut the outer surface of the mounting portion when the fan module 10 is placed on the mounting plate 31. In this situation, the fan module 10 is correctly placed on the cage 30. The outer surface of the second sidewall abuts the mounting plate 31, and the second mounting holes 1351 are aligned with the securing holes 317. A plurality of first fasteners, such as screws, may be used to secure the fan module 10 to the mounting plate 31.

Figure 6:
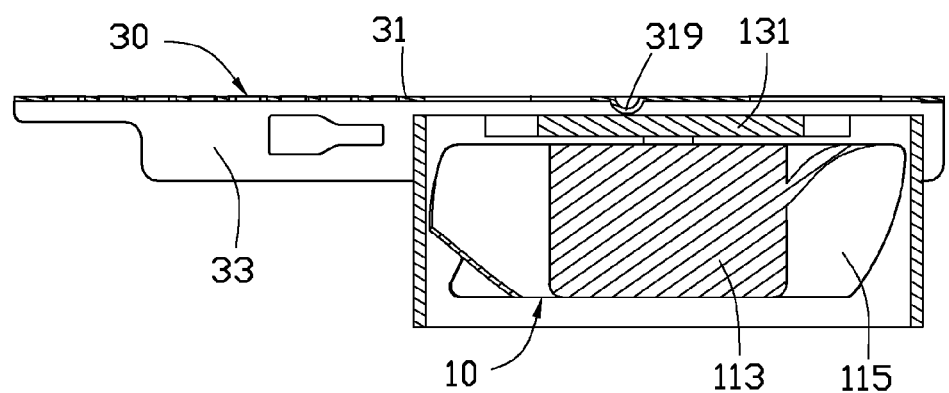
FIG. 6 is similar to FIG. 5, but shows the fan module placed in an opposite direction and incorrectly assembly.

Referring also to FIG. 6, if the first sidewall 131 of the fan module 10 is placed on the inner surface of the positioning portion, because the distance H of the restriction 319 is greater than the first distance D1, the restriction 319 abuts the outer surface of the mounting portion when the fan module 10 is placed on the mounting plate 31. The rocking and general instability of the fan module 10 in this situation indicates that the module 10 is incorrectly placed on the cage 30.

Figure 7:
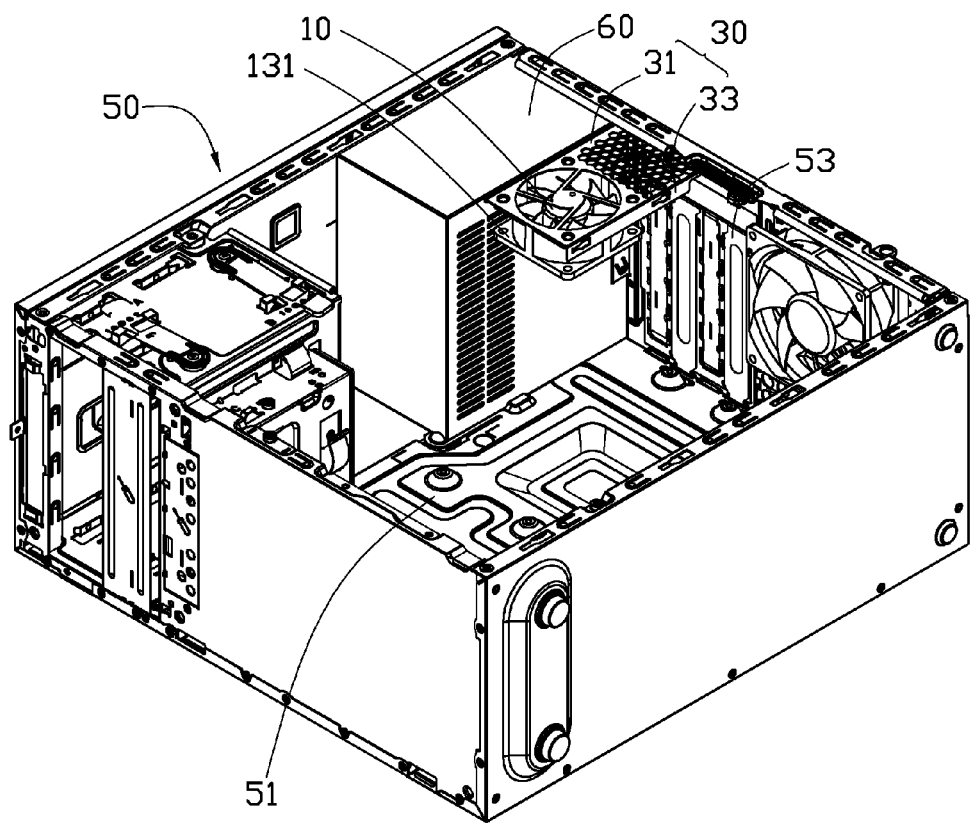
FIG. 7 is a view of an assembled electronic device in accordance with an embodiment.

Referring to FIG. 7, the cage 30 is secured to a computer enclosure 50. The computer enclosure 50 includes a bottom plate 51 and a side plate 53 substantially perpendicular to the bottom plate 51. A power supply cage 60 is secured to the side plate 53. A second fastener, such as a screw, is engaged in the installing hole 351 and a fixing hole defined in the side plate 53, to secure the cage 30 to the inner surface of the side plate.

After the fan module 10 and the cage 30 are secured to the computer enclosure 50, the mounting plate 31 is substantially perpendicular to the side plate 53 and substantially parallel to the bottom plate 51. The flange 33 is substantially perpendicular to the side plate 53 and the bottom plate 51. The ear 35 is secured to the side plate 53. The first and second sidewalls 131, 135 are substantially perpendicular to the mounting plate 31.

It is to be understood, however, that even though numerous characteristics and advantages have been set forth in the foregoing description of embodiments, together with details of the structures and functions of the embodiments, the disclosure is illustrative only and changes may be made in detail, especially in the matters of shape, size, and arrangement of parts within the principles of the disclosure to the full extent indicated by the broad general meaning of the terms in which the appended claims are expressed.

What is claimed is:

1. An electronic device comprising:
   a cage comprising a mounting plate, the mounting plate defining a ventilation hole, a positioning portion located in the ventilation hole and connected to the mounting plate, and a restriction located on an inner surface of the positioning portion, wherein a height of the restriction is defined relative to the inner surface of the positioning portion; and
   a fan module secured to the mounting plate, the fan module comprising:
      a bracket comprising a body, a first sidewall, and a second sidewall, the first and second sidewalls respectively located on opposite sides of the body, the bracket defining a holding space through the first sidewall, the body and the second sidewall, a mounting portion located in the holding space and connected to the first sidewall, a first distance defined between an outer surface of the first sidewall and an outer surface of the mounting portion, and the first distance less than the height of the restriction; and
      a fan received in the holding space and secured to the mounting portion, comprising a motor having a flat bottom horizontal outer surface away from the first sidewall but close to the second sidewall, a second distance defined between the flat bottom horizontal outer surface of the motor and an outer surface of the second sidewall, and the second distance greater than the height of the restriction.

2. The electronic device of claim 1, wherein the first side wall is substantially parallel to the second sidewall and the mounting plate.

3. The electronic device of claim 1, wherein the positioning portion includes a base and four fingers connected to the mounting plate, and each of the four fingers is substantially perpendicular to an adjacent finger.

4. The electronic device of claim 3, wherein the restriction is located on an inner surface of the base.

5. The electronic device of claim 3, wherein the positioning portion is a thin piece.

6. The electronic device of claim 1, further comprising a computer enclosure, the computer enclosure comprising a bottom plate, a side plate substantially perpendicular to the bottom plate, and a power supply cage secured to the side plate, the cage secured to the side plate closed to the power supply cage.

7. The electronic device of claim 6, wherein the mounting plate is substantially perpendicular to the side plate and parallel to the bottom plate.

8. The electronic device of claim 6, wherein the cage further comprises a flange substantially perpendicular to the mounting plate, and the flange is substantially perpendicular to the bottom plate and the side plate.

9. The electronic device of claim 6, wherein an ear is located on the mounting plate and secured to the side plate.

10. An electronic device comprising:
    a cage comprising a mounting plate, the mounting plate defining a ventilation hole, a positioning portion located in the ventilation hole and connected to the mounting plate, and a restriction located on an inner surface of the positioning portion; and
    a fan module secured to the mounting plate, the fan module comprising:
       a bracket comprising a body, a first sidewall and a second sidewall, the first and second sidewalls respectively located on opposite sides of the body, the bracket defining a holding space through the first sidewall, the body and the second sidewall, a mounting portion located in the holding space and connected to the first sidewall; and
    a fan, received in the holding space and secured to the mounting portion, comprising a motor having a flat bottom horizontal outer surface away from the first sidewall but close to the second sidewall;
    wherein when the fan module is placed on the mounting plate and the first sidewall is positioned between the second sidewall and the mounting plate, the restriction abuts on the mounting portion; and when the second sidewall abuts the mounting plate, the restriction is located in the holding space between the flat bottom horizontal outer surface of the motor and the mounting plate.

11. The electronic device of claim 10, wherein a height of the restriction is defined relative to the inner surface of the positioning portion, a first distance is defined between an outer surface of the first sidewall and an outer surface of the mounting portion, the first distance is less than the height of the restriction, a second distance is defined between the flat bottom horizontal outer surface of the motor and an outer surface of the second sidewall, and the second distance is greater than the height of the restriction.

12. The electronic device of claim 10, wherein the first side wall is substantially parallel to the second sidewall and the mounting plate.

13. The electronic device of claim 10, wherein the positioning portion includes a base and four fingers connected to the mounting plate, and each of the four fingers is substantially perpendicular to an adjacent finger.

14. The electronic device of claim 13, wherein the restriction is located on an inner surface of the base.

15. The electronic device of claim 10, further comprising a computer enclosure, the computer enclosure comprising a bottom plate, a side plate substantially perpendicular to the bottom plate, and a power supply cage secured to the side plate, the cage secured to the side plate closed to the power supply cage.

16. The electronic device of claim 15, wherein the mounting plate is substantially perpendicular to the side plate and parallel to the bottom plate.

17. The electronic device of claim 15, wherein the cage further comprises a flange substantially perpendicular to the mounting plate, and the flange is substantially perpendicular to the bottom plate and the side plate.

18. The electronic device of claim 15, wherein an ear is located on the mounting plate and secured to the side plate.

* * * * *